US012740024B2

(12) United States Patent
Borø et al.

(10) Patent No.: US 12,740,024 B2
(45) Date of Patent: Sep. 15, 2026

(54) SYSTEM AND METHOD FOR DELIVERING COOLING WATER TO SUBMERGED DATA PROCESSING EQUIPMENT

(71) Applicant: Orca Connex AS, Kristiansand S (NO)

(72) Inventors: Yngvar Borø, Søgne (NO); Roar Berge, Kristiansand S (NO); Andreas Hauland Næss, Kristiansand (NO); Sigurd Tollevik, Kristiansand (NO)

(73) Assignee: Orca Connex AS, Kristiansand S (NO)

(*) Notice: Subject to any disclaimer, the term of this patent is extended or adjusted under 35 U.S.C. 154(b) by 0 days.

(21) Appl. No.: 19/107,697

(22) PCT Filed: Aug. 14, 2023

(86) PCT No.: PCT/NO2023/060031
§ 371 (c)(1), (2) Date: Feb. 28, 2025

(87) PCT Pub. No.: WO2024/054116
PCT Pub. Date: Mar. 14, 2024

(65) Prior Publication Data

US 2026/0006759 A1 Jan. 1, 2026

(30) Foreign Application Priority Data

Sep. 5, 2022 (NO) .................................... 20220954

(51) Int. Cl.
*H05K 7/20* (2006.01)

(52) U.S. Cl.
CPC ................................ *H05K 7/20781* (2013.01)

(58) Field of Classification Search
CPC ........ H05K 7/1432; H05K 7/20; H05K 7/203; H05K 7/20218; H05K 7/20236;
(Continued)

(56) References Cited

U.S. PATENT DOCUMENTS 10,634,113 B2 * 4/2020 Sheldon-Coulson ... F03B 13/24
12,195,142 B2 * 1/2025 Sheldon-Coulson ........................ F03B 13/142

(Continued)

FOREIGN PATENT DOCUMENTS

EP 2487326 A1 8/2012
EP 2988579 A1 2/2016

(Continued)

OTHER PUBLICATIONS

Search Report issued in Norwegian Application No. 20220954, dated Apr. 13, 2023.

(Continued)

*Primary Examiner* — Amir A Jalali
(74) *Attorney, Agent, or Firm* — Andrus Intellectual Property Law, LLP

(57) ABSTRACT

A system is for cooling at least one computing device using water. The system has a body of water defining a first waterline and a structure at least partially submerged in the body of water. An internal volume of water defines a second waterline. At least one outlet drains water from the internal volume of water to the body of water. A container is at least partially submerged in the internal volume of water and has at least one computing device that generates heat in use. An inlet pipe has a pump to move water from the body of water to the internal volume of water. A flow path of water is provided across the container towards the at least one outlet. The second waterline is at a height above the first waterline to drive the flow path to provide cooling of the container and computing device therein.

20 Claims, 1 Drawing Sheet

(58) Field of Classification Search
CPC ........... H05K 7/20263; H05K 7/20272; H05K 7/2029; H05K 7/20318; H05K 7/20327; H05K 7/20336; H05K 7/20381; H05K 7/20409; H05K 7/20781; H05K 7/2079; B63B 35/00; F25D 1/02
See application file for complete search history.

(56) References Cited

U.S. PATENT DOCUMENTS

2002/0173266 A1 11/2002 Sharp
2013/0083476 A1 4/2013 Clidaras
2015/0382511 A1 12/2015 James
2015/0382515 A1 12/2015 James
2017/0049005 A1 2/2017 Chen
2017/0280577 A1 9/2017 Laneryd
2018/0054916 A1 2/2018 Kosugi
2018/0153059 A1 5/2018 Dehlsen
2019/0219311 A1 7/2019 Smith
2019/0353139 A1* 11/2019 Sheldon-Coulson ........................ H02K 7/1823
2020/0348034 A1 11/2020 Magcale
2022/0314147 A1* 10/2022 Baetzold ................ B01D 35/26
2023/0080447 A1* 3/2023 Shah .................. H05K 7/20836 361/679.53
2023/0240051 A1* 7/2023 Gao ................... H05K 7/20818 361/688
2023/0324322 A1* 10/2023 Tuma ................. H05K 7/20818 73/61.41
2023/0389231 A1* 11/2023 Chen ...................... H05K 7/203
2024/0057286 A1* 2/2024 Lin .................... H05K 7/20645

FOREIGN PATENT DOCUMENTS

JP 2017002905 A 1/2017
SE 1400472 A1 10/2014
WO 2019222421 A1 11/2019
WO 2020104700 A1 5/2020

OTHER PUBLICATIONS

Inernational Search Report and the Written Opinion for PCT/NO2023/060031, dated Dec. 5, 2023.
Response to the Written Opinion for PCT/NO2023/060031, dated Jan. 9, 2024.
Second Written Opinion for PCT/NO2023/060031, dated Mar. 12, 2024.
Response to the Written Opinion for PCT/NO2023/060031, dated Jun. 11, 2024.
International Preliminary Report on Patentability for PCT/NO2023/060031, dated Dec. 16, 2024.

* cited by examiner

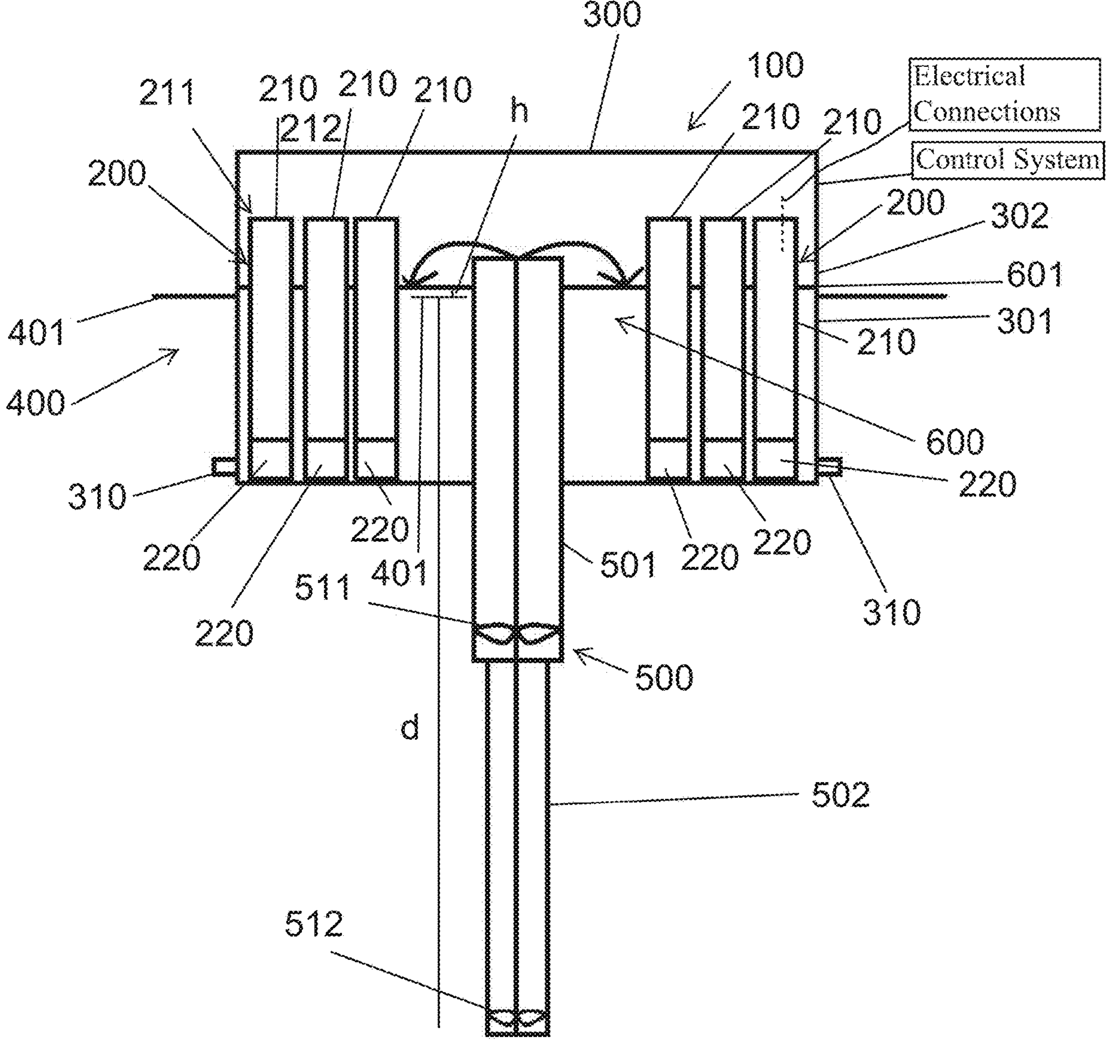
300
100
Electrical Connections
Control System
211
210
210
210
212
h
210
210
200
200
302
601
401
301
210
400
600
310
220
220
220
220
220
220
220
401
501
310
511
500
d
502
512

SYSTEM AND METHOD FOR DELIVERING COOLING WATER TO SUBMERGED DATA PROCESSING EQUIPMENT

CROSS-REFERENCE TO RELATED APPLICATIONS

This application is the U.S. national stage application of International Application No. PCT/NO2023/060031, filed Aug. 14, 2023, which international application was published on Mar. 14, 2024, as WO 2024/054116 in the English language. The International Application claims priority to Norwegian patent application Ser. No. 20/220,954, filed Sep. 5, 2022. The international application and Norwegian application are both incorporated herein by reference, in their entirety.

FIELD

The present invention relates to cooling of data centres. More specifically, the invention relates to a system and method for delivering cooling water to submerged data centres.

BACKGROUND

A data centre is a collection of computing infrastructure, including but not limited to: routers, servers, switches, hard drives and controllers. Operating a large data centre is an energy intensive project. A large amount of electricity is used to run a large data centre, therefore energy costs of operation are a major consideration in the design of a new data centre.

Electrical energy costs are incurred in providing power to the actual computers and network components of the data centre such that they can operate to store, maintain and retrieve data properly. Additional substantial electrical energy is provided to keep the data centre sufficiently cool such that it does not overheat or malfunction.

Many solutions have been proposed to keep data centres sufficiently cool in an energy efficient way.

US patent document US 2017/0049005A1 discloses systems and methods for cooling a computing facility housed in a structure surrounded by or nearby water. An inlet and outlet are defined in a hull of a structure and a fluid path extends between the inlet and outlet. The fluid path is configured to cool the computers of the facility as water from a body of water passes through the fluid path. The fluid path may include one or both of inlet and outlet siphons to draw water down into a basin positioned below the waterline. The fluid path between the inlet and the outlet may be closed and flow from the inlet to the outlet may be partially or completely driven by convection. Fluid flow may also be driven by gravity by placing an end of an outlet tube below the water line, such as adjacent a dam or other barrier bounding the body of water.

US patent document US 2018/0153059A1 discloses a marine subsea data vessel including a plurality of server boards in certain embodiments forming a carousel, coupled with a heat exchanger. The heat exchanger operates to extract heat and transfer the heat to seawater entirely surrounding the marine subsea data vessel. The heat transfer may be through the outer shell of the vessel, or via an external heat exchanger, or both.

A further known problem is the presence of marine life on data centres submerged in cooling water. It is known that marine life greatly impacts the ability of the data centre or heat exchangers associated with the data centres to transfer heat to the cooling water. In this connection, regular cleaning is required to ensure optimal cooling. Regular cleaning is time consuming and requires access to the data centre which may be located at a remote location. Furthermore, there may be a down period in which the data centre cannot be used while it is cleaned of marine life. As cleaning and maintenance intervals are reduced, the operating cost of running a data centre is increased.

US patent document US2020/0348034A1 discloses a self-sustained, submerged waterborne data centre facility that utilises a closed-looped heat management system.

US patent document US2015/0382511 discloses a submerged data centre which may be made up of modules. The data centre may be submerged into a body of water such as the ocean. The submersion facilitates cooling of the data centre as well as providing protection of the data centre from environmental conditions that exist at or near the surface.

US patent document US2018/0054916A1 discloses an underwater data centre including an electronic device; a housing member that houses the electronic device and that is configured to be disposed under water; and a heat exchanger that is provided at the housing member and that is configured to discharge, into the water, heat discharged from the electronic device.

International patent application number WO2019/222421A1 discloses a buoyant wave energy device that incorporates an open-bottomed tube of substantial length in which is partially enclosed a first body of water that oscillates in response to wave action. Periodically, a pocket of air trapped at the top of the tube is compressed. The subsequent expulsion of the pressurised air through a turbine generates electrical power.

The invention has for its object to remedy or to reduce at least one of the drawbacks of the prior art, or at least provide a useful alternative to the prior art.

The object is achieved through features, which are specified in the description below and in the claims that follow.

SUMMARY

According to a first aspect of the invention, there is provided a system for cooling at least one computing device using water, the system comprising: a body of water defining a first waterline; a structure at least partially submerged in the body of water and comprising: an internal volume of water defining a second waterline; at least one outlet configured to drain water from the internal volume of water to the body of water; a container at least partially submerged in the internal volume of water and comprising at least one computing device configured to generate heat in use; an inlet pipe configured with a pump to move water from the body of water to the internal volume of water; and a flow path of water across the container towards the at least one outlet; wherein the second waterline is at a height above the first waterline to drive the flow path to provide cooling of the container and at least one computing device therein.

The system may be used to provide a constant stream of cold water from a deep point in the body of water to efficiently maintain the at least one computing device at a suitable temperature. The system may provide an economic way of cooling the at least one computing device.

The body of water may be one of: a sea; an ocean; a lake; a river; a reservoir or a fjord.

The structure may be a boat or a ship or an offshore platform or a floating structure. The structure may be part of a boat or a ship or an offshore platform or a floating structure. The structure may be configured to rest on the seabed or to engage the seabed.

The structure may define an internal space, wherein the internal volume of water and container are in the internal space.

The internal space may be sealed such that the environment within the internal space can be controlled. Advantageously, control of the environmental conditions in the internal space may result in less marine growth on the container which can impact the cooling ability of the container.

The at least one outlet may comprise at least one flow control device configured to control the flow of water from the internal volume of water to the body of water. Advantageously, regulation of the flow of water from the internal volume allows the height of the second waterline to be maintained above the first waterline, to ensure an overpressure is maintained.

The container may comprise a heat exchanger configured to remove heat from the computing device, wherein the flow path of water across the container is at least partially across the heat exchanger. Advantageously, a heat exchanger may provide for efficient removal of heat from the container.

The container may comprise at least one electrical connection for receiving power and/or data communications, wherein the at least one electrical connection is located on a portion of the container not submerged in water. Advantageously, the electrical connection can be kept dry to ensure a safe and reliable connection.

The inlet pipe may be between 20 m and 200 m long, or between 50 m and 150 m long, or between 75 m and 125 m long or around 100 m long. Advantageously, a long inlet pipe is able to reach deep into the water such that colder water can be brought into the internal volume to cool the computing device.

The inlet pipe may be configured to move water from a depth in the body of water which is deeper than the draught of the structure.

The inlet pipe may be telescopic. The inlet pipe may be configured to move between a collapsed configuration and an expanded configuration. Advantageously, this allows the inlet pipe to be adjusted to reach deeper water which may be colder if the computing device is not being sufficiently cooled. Additionally, this allows the inlet pipe to reach zones with better water quality, if the water is not of sufficient quality (for example has high concentrations of many microorganisms) at shallower depths.

The inlet pipe may be arranged to deliver water to the internal volume above the second waterline.

The inlet pipe may be arranged to deliver water to the internal volume in an upper half of the internal volume.

The height of the second waterline above the first waterline may be between 1 cm and 1 m, or between 1 cm and 10 cm, or between 4 cm and 8 cm, or between 5 cm and 6 cm.

The at least one outlet may comprise a plurality of outlets. Advantageously, a plurality of outlets may allow the flow path to spread out evenly through the internal volume, providing optimised cooling.

The system may further comprise a control system configured to control the pumping of water through the inlet pipe and the draining of water through the at least one outlet, such that the second waterline is maintained at a height above the first waterline. Advantageously, the control system may autonomise the regulation of the flow such that the second waterline is maintained at a height above the first waterline. Additionally, the control system may stop pumping when it is not required to continue pumping because the second waterline has reached a threshold maximum height. Stopping at the maximum height will reduce the energy consumption of the cooling system, as it is not beneficial to continue pumping water into the internal volume beyond the maximum height as a sufficient overpressure can be obtained at or below the maximum height, so any additionally height gained may waste energy.

The inlet pipe may be configured to move water from a depth in the body of water where the temperature of the water is less than at the surface of the body of water. Advantageously, this may provide cold water which can efficiently cool the computing device.

The structure may be partially opaque or fully opaque. Advantageously, this May protect the container and/or heat exchanger from the unwanted growth of marine life, which can reduce the efficiently of heat transfer from the container and/or heat exchanger. Advantageously, reducing marine growth may also reduce the required maintenance and cleaning.

According to a second aspect of the invention, there is provided a system for cooling a computing device using water, the system comprising: a body of water defining a first waterline; a structure at least partially submerged in the body of water and comprising: an internal volume of water defining a second waterline; an outlet configured to drain water from the internal volume of water to the body of water; a computing device configured to generate heat in use and at least partially submerged in the internal volume of water; an inlet pipe configured with a pump to move water from the body of water to the internal volume of water; and a flow path of water across the computing device towards the outlet; wherein the second waterline is at a height above the first waterline to drive the flow path to provide cooling of the computing device.

According to a third aspect of the invention, there is provided a system for cooling a data centre using water, the system comprising: a body of water defining a first waterline; a structure at least partially submerged in the body of water and comprising: an internal volume of water defining a second waterline; at least one outlet configured to drain water from the internal volume of water to the body of water; a plurality of containers each at least partially submerged in the internal volume of water and together comprising a data centre configured to generate heat in use; an inlet pipe configured with a pump to move water from the body of water to the internal volume of water; and a flow path of water across the plurality of containers towards the at least one outlet; wherein the second waterline is at a height above the first waterline to drive the flow path to provide cooling of the plurality of containers and the data centre therein.

According to a fourth aspect of the invention, there is provided a method of cooling at least one computing device using water, the method comprising the steps of: providing a system for cooling at least one computing device according to the first aspect of the invention; pumping water from the body of water to the internal volume of water to maintain the second waterline at a height above the first waterline; and maintaining a flow path of water across the container by draining water from the internal volume to the body of water via the at least one outlet.

The step of pumping water may comprise pumping water from a depth deeper than the draught of the structure.

The step of pumping water may comprise pumping water from a depth in the body of water where the water temperature is lower than at the surface of the body of water.

BRIEF DESCRIPTION OF THE DRAWINGS

An embodiment of the invention will now be described with reference to the following drawing, in which FIG. 1 shows a system for cooling a data centre.

For clarity reasons, some elements may be without reference numerals. A person skilled in the art will understand that the FIGURE is just a principal drawing. The relative proportions of individual elements may also be distorted.

DETAILED DESCRIPTION OF THE DRAWINGS

FIG. 1 shows a system 100 for providing cooling water to a data centre 200. The data centre 200 comprises a plurality of computing devices (not shown) located in vertically positioned containers 210. In some examples the computing devices (not shown) may be arranged in racks within the containers 210. The actual configuration of the computing devices within the containers is not important, and suitable configurations will be apparent to a person skilled in the art.

In the presently described example, the computing devices within the containers 210 are a plurality of servers and network components such as routers, network switches, storage devices and processors. It will be understood by a person skilled in the art that the computing devices may be any collection of one or more electrically powered devices which give off heat and must be maintained at a sufficiently cool temperature such that they do not overheat and/or malfunction. Each container 210 comprises a heat exchanger 220 configured to draw heat from the computing devices within the containers 210. There are many types and configurations of heat exchangers 220 which may be suitable for use with the containers 210. The specific type or configuration of the heat exchanger 220 is not important.

The system 100 comprises a main structure 300 within which the containers 210 are arranged, as shown in FIG. 1. The structure 300 is configured to be located in a volume of water 400 such as a sea, ocean, lake, river, reservoir, fjord or another natural or man-made body of water. As shown in FIG. 1, the structure 300 is configured to be partially submerged in the volume of water 400. That is to say, the structure 300 is configured to float in the volume of water 400 such that a lower portion 301 of the structure 300 is submerged in the volume of water 400 and an upper portion 302 of the structure 300 is maintained unsubmerged in the volume of water 400. In some alternative examples, the structure may be configured to be fully submerged in the volume of water 400.

The system 100 further comprises an inlet pipe 500 comprising an upper section 501 and a lower section 502. The upper 501 and lower 502 sections are arranged in a telescoping arrangement such that the length of the inlet pipe 500 can be adjusted, the purpose of which will be explained in more detail later. The inlet pipe 500 comprises first and second fluid pumps 511, 512 configured to pump water from a depth d below a surface 401 of the volume of water 400 to a height h above the surface 401 of the volume of water 400. In the presently described example, two fluid pumps 511, 512 are used to assist in pumping water from a deep depth d below the surface 401 of the volume of water 400. It will be understood that in some examples only one fluid pump may be sufficient to pump water from a depth d. In some examples, another means of lifting water from a depth d may be provided.

The structure 300 is partially filled with water in use, as can be seen in FIG. 1. In this connection, there is an internal volume of water 600 comprising a water surface 601. The containers 210 are arranged to be partially submerged in the internal volume of water 600, thereby allowing an upper portion 211 of each container 210 to be maintained dry and out of the water usefully providing a safe and dry environment for electrical connections (not shown) to the computer devices within the containers 210 to be made. In some examples (not shown) it may be preferred to completely submerge the containers 210 in water such that optimal cooling can be achieved. In such cases, electrical connection may be made via waterproof connectors.

Water can drain from the structure 300 into the volume of water 400 within which the structure 300 is floating, through outlet ports 310. The outlet ports 310 may be provided with flow control devices such that the flow through the outlet ports 310 can be controlled and/or stopped. In this connection, the control of flow through the outlet ports 310 may be manually operated, or the outlet ports 310 may be controlled by a control system, as will be explained in more detail later.

The system 100 described above with reference to FIG. 1 can be used to provide cold water to the containers 210 housing the data centre 200, thereby maintaining the data centre 200 at a sufficiently cool temperature, as will now be described.

It will be understood that in large volumes of water, the temperature of the water generally decreases as depth increases. To cool the data centre 200, the system 100 is used to deliver water from a depth d and either directly or indirectly cool the data centre 200. Firstly, the system is arranged as shown in FIG. 1 and as described above. Cold water is then pumped from a depth d using the first 511 and/or second 512 pump, and is delivered to the internal volume 600. The water surface 601 of the internal volume of water 600 is maintained at a height h above the water surface 401 of the volume of water 400 within which the structure 300 floats. The first 511 and/or second 512 pumps are operated in conjunction with the outlet ports 310 and associated flow control devices to regulate the volume of water in the internal volume 600. In this connection, the surface 601 of the internal volume 600 is maintained at a height h above the water surface 401, thereby creating an overpressure such that the internal volume 600 of water flows to the outlets 310. Constant pumping of cold water from the depth d by the first 511 and/or second 512 pumps results in a constant overpressure and a constant flow of cold water over the heat exchangers 220.

In the example shown in FIG. 1, the inlet pipe 500 is arranged to deliver water to the internal volume 600 above the water surface 601. It will be understood that the inlet pipe 500 may be arranged in other examples to deliver water to any suitable location inside the structure 300 such that the volume of water in the internal volume 600 can be maintained such that the height h of the water surface 601 of the internal volume 600 can be maintained above the water surface 401 of the volume of water 400 external to the structure 300. For example, the inlet pipe 500 may deliver water at a central location within the internal volume 600, rather than above the water surface 601 of the internal volume 600. It is preferred that the water is delivered at a location higher in the internal volume 600 such that the cold water then flows downwards over the containers 210 and most preferably over the heat exchangers 220. In this connection, it is preferred that the water is delivered at a location in the upper half of the internal volume 600.

Heat is transferred from the heat exchangers 220 to the cold water as it passes over the heat exchangers 220. In this way, the data centre 200 is indirectly cooled.

The term indirectly is used to indicate that heat is transferred from the data centre 200 to a cooling medium in the heat exchangers 220. Heat is then transferred from the cooling medium in the heat exchangers 220 to the cold water passing over the heat exchangers 220.

It will be appreciated that in the presently described example some of the cold water will pass over the submerged portions of the containers 210. In this connection, the data centre 200 may also be cooled by the cooling effect of the cold water passing over the submerged portions of the containers 210. However, it will be appreciated that a dedicated heat exchanger 220 may efficiently remove heat from the data centre 200, which can then be transferred to the cold water.

In other examples (not shown), the cold water may be used to directly remove heat from the data centre 200. In this connection, the components of the data centre 200 may be open to the cold water, and the cold water may flow directly over these components thereby cooling them. It is preferred that the data centre 200 is enclosed in containers 210 as in the example described with reference to FIG. 1, as the containers 210 protect the data centre 200 from exposure to microorganisms in the water and the corrosive effects of salt water (when the structure 300 is placed in saltwater). Protecting the data centre 200 from microorganisms and salt water may allow a longer cleaning and maintenance period, which is economically beneficial, particularly when the data centre 200 is located in a particularly remote or hard to reach location.

Still referring to FIG. 1, the inlet pipe 500 may be configured to reach a depth d of around 20 m in some examples, or around 50 m, 100 m, 150 m or 200 m in other examples. In the presently described example the inlet pipe 500 is telescopic, therefore the depth d to which the inlet pipe 500 reaches may be easily adjusted. The inlet pipe 500 in the presently described example may telescope from 75 m in a collapsed configuration to 150 m in an expanded configuration. The depth d may be adjusted by manual adjustment of the telescoping function of the inlet pipe 500. Alternatively, the depth d may be adjusted by a control system.

The inlet pipe 500 may be provided with sensors to detect the water temperature at the depth d. In this connection, the depth d may be adjusted such that a suitable temperature of water is delivered to the internal volume 600 to provide optimum and efficient cooling of the data centre 200.

For example, if the system 100 is operating with the inlet pipe 500 at a depth of 75 m (i.e. with the inlet pipe 500 in a collapsed configuration), where water temperature is 6 degrees Celsius, and the data centre 200 is still too hot, the inlet pipe 500 may be extended to a depth of 100 m, where the water temperature is 4 degrees Celsius, thereby improving the cooling of the data centre 200. If the data centre 200 heats up further, the inlet pipe 500 may be extended further until it reaches its maximum extent at a depth of 150 m in the expanded configuration, where the water is 3 degrees Celsius. Therefore, the data centre 200 can be cooled even further. It will be appreciated that the telescopic inlet pipe 500 in the presently described example is a two-piece telescoping construction, however any number of pieces may be used in other examples.

The telescopic function of the inlet pipe 500 may also be used to adjust the zone from which the water fed into the internal volume 600 is supplied from. In this connection, the inlet pipe 500 may be adjusted to a deliver water from a deeper depth if the water brought into the internal volume is detected to have concentrations of algae or other microorganisms present. Extension of the inlet pipe 500 allows deeper water with reduced oxygen content to be reached. The deeper water may have reduced concentrations of algae and other microorganisms.

The internal volume 600 may be provided with suitable sensors to measure water quality. Additionally, the structure 300 may be sealed to the environment and comprise environmental sensors such that the air quality within the structure 300 can be monitored. Monitoring of air and water quality allows for an optimised environment to ensure that barnacles and other marine growth are inhibited from forming and growing on the containers 210 and/or heat exchangers 220. Growth of such marine life would greatly affect the cooling ability of the containers 210 and/or heat exchangers 220. Furthermore, marine life growth may lead to more regular cleaning of the containers 210 and/or heat exchangers 220.

The first 511 and/or second 512 pump may be in communication with the flow control devices (not shown) at the outlet ports 310 such that it can be ensured that the height h of the surface 601 of the internal volume 600 is above the surface 401 of the volume of water 400, thereby maintaining an overpressure. The height h in the presently described example may be around 5-6 cm. In some examples the height h may be 10 cm or 1 m. It will be understood that pumping water to a height h consumes energy, therefore it may be desirable to maintain a relatively low height h such that a sufficient overpressure is maintained but energy consumption in pumping to the height h is not excessive.

The structure 300, although only shown in two dimensions in FIG. 1, may be provided in a plurality of different shapes. For example, the structure 300 may in some examples be a hexagonal prism. In some examples (not shown), a plurality of structures 300 may be provided with mechanical connections between the structures 300. In this connection, the plurality of structures 300 may be configured to be connected together in a modular fashion.

The structure 300 may in some examples comprise opaque surfaces such that no light can be transmitted through parts of the structure 300. In this connection, light can be stopped from reaching the containers 210 and heat exchangers 220 to further inhibit marine growth thereon. In some examples the structure 300 may be entirely opaque.

The structure 300 may be connected to or be part of a larger vessel such as a boat, ship, offshore platform or floating structure. In some examples the structure 300 may itself be a ship or boat, wherein the containers 210 are arranged in the hull of the ship or boat.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements.

The mere fact that certain measures are recited in mutually different dependent claims does not indicate that a combination of these measures cannot be used to advantage.

CLAUSES

Clause 1. A system (100) for cooling at least one computing device using water, the system (100) comprising: a body of water (400) defining a first waterline (401); a structure (300) at least partially submerged in the body of water (400) and comprising: an internal volume of water (600) defining a second waterline (601); at least one outlet (310) configured to drain water from the internal volume of water (600) to the body of water (400); a container (210) at least partially submerged in the internal volume of water (600) and comprising at least one computing device configured to generate heat in use; an inlet pipe (500) configured with a pump (511) to move water from the body of water (400) to the internal volume of water (600); and a flow path of water across the container (210) towards the at least one outlet (310); wherein the second waterline (601) is at a height above the first waterline (401) to drive the flow path to provide cooling of the container (210) and at least one computing device therein.

Clause 2. The system (100) according to clause 1, wherein the body of water (400) is one of: a sea; an ocean; a lake; a river; a reservoir or a fjord.

Clause 3. The system (100) according to clause 1 or 2, wherein the structure (300) is or is part of a boat or a ship or an offshore platform or a floating structure.

Clause 4. The system (100) according to any preceding clause, wherein the structure (300) defines an internal space, wherein the internal volume of water (600) and container (210) are in the internal space.

Clause 5. The system (100) according to clause 4, wherein the internal space is sealed such that the environment within the internal space can be controlled.

Clause 6. The system (100) according to any preceding clause, wherein the at least one outlet (310) comprises at least one flow control device configured to control the flow of water from the internal volume of water (600) to the body of water (400).

Clause 7. The system (100) according to any preceding clause, wherein the container (210) comprises a heat exchanger (220) configured to remove heat from the computing device, wherein the flow path of water across the container (210) is at least partially across the heat exchanger (220).

Clause 8. The system (100) according to any preceding clause, wherein the container (210) comprises at least one electrical connection for receiving power and/or data communications, wherein the at least one electrical connection is located on a portion (302) of the container (210) not submerged in water.

Clause 9. The system (100) according to any preceding clause wherein the inlet pipe (500) is between 20 m and 200 m long, or between 50 m and 150 m long, or between 75 m and 125 m long or around 100 m long.

Clause 10. The system (100) according to any preceding clause, wherein the inlet pipe (500) is configured to move water from a depth (d) in the body of water (400) which is deeper than the draught of the structure.

Clause 11. The system (100) according to any preceding clause, wherein the inlet pipe (500) is telescopic and is configured to move between a collapsed configuration and an expanded configuration.

Clause 12. The system (100) according to any preceding clause, wherein the inlet pipe (500) is arranged to deliver water to the internal volume above the second waterline (601).

Clause 13. The system (100) according to any of clauses 1 to 11, wherein the inlet pipe is arranged to deliver water to the internal volume in an upper half of the internal volume.

Clause 14. The system (100) according to any preceding clause, wherein the height (h) of the second waterline (601) above the first waterline (401) is between 1 cm and 1 m, or between 1 cm and 10 cm, or between 4 cm and 8 cm, or between 5 cm and 6 cm.

Clause 15. The system (100) according to any preceding clause, wherein the at least one outlet (310) comprises a plurality of outlets.

Clause 16. The system (100) according to any preceding clause, further comprising a control system configured to control the pumping of water through the inlet pipe (500) and the draining of water through the at least one outlet (310), such that the second waterline (601) is maintained at a height above the first waterline (401).

Clause 17. The system (100) according to any preceding clause, wherein inlet pipe (500) is configured to move water from a depth (d) in the body of water (400) where the temperature of the water is less than at the surface (401) of the body of water (400).

Clause 18. The system (100) according to any preceding clause, wherein the structure (300) is partially opaque or fully opaque.

Clause 19. A system (100) for cooling a computing device using water, the system (100) comprising: a body of water (400) defining a first waterline (401); a structure (300) at least partially submerged in the body of water (400) and comprising: an internal volume of water (600) defining a second waterline (601); an outlet (310) configured to drain water from the internal volume of water (600) to the body of water (400); a computing device configured to generate heat in use and at least partially submerged in the internal volume of water (600); an inlet pipe (500) configured with a pump (511) to move water from the body of water (400) to the internal volume of water (600); and a flow path of water across the computing device towards the outlet (310); wherein the second waterline (601) is at a height above the first waterline (401) to drive the flow path to provide cooling of the computing device.

Clause 20. A system (100) for cooling a data centre using water, the system (100) comprising: a body of water (400) defining a first waterline (401); a structure (300) at least partially submerged in the body of water (400) and comprising: an internal volume of water (600) defining a second waterline (601); at least one outlet (310) configured to drain water from the internal volume of water (600) to the body of water (400); a plurality of containers (210) each at least partially submerged in the internal volume of water (600) and together comprising a data centre configured to generate heat in use; an inlet pipe (500) configured with a pump (511) to move water from the body of water (400) to the internal volume of water (600); and a flow path of water across the plurality of containers (210) towards the at least one outlet (310); wherein the second waterline (601) is at a height (h) above the first waterline (401) to drive the flow path to provide cooling of the plurality of containers (210) and the data centre therein.

Clause 21. A method of cooling at least one computing device using water, the method comprising the steps of: providing a system (100) for cooling at least one computing device according to any of clauses 1 to 18; pumping water from the body of water (400) to the internal volume of water (600) to maintain the second waterline (601) at a height (h) above the first waterline (401); and maintaining a flow path of water across the container (210) by draining water from the internal volume (600) to the body of water (400) via the at least one outlet (310).

Clause 22. The method according to clause 21, wherein the step of pumping water comprises pumping water from a depth (d) deeper than the draught of the structure (300).

Clause 23. The method according to clause 21 or 22, wherein the step of pumping water comprises pumping water from a depth (d) in the body of water (400) where the water temperature is lower than at the surface (401) of the body of water (400).

The invention claimed is:

1. A system for cooling at least one computing device using water, the system comprising:

a body of water defining a first waterline;

a structure at least partially submerged in the body of water and comprising:

an internal volume of water defining a second waterline;

at least one outlet configured to drain water from the internal volume of water to the body of water;

a container at least partially submerged in the internal volume of water and comprising the at least one computing device configured to generate heat in use;

an inlet pipe configured with a pump to move water from the body of water to the internal volume of water; and a flow path of water across the container towards the at least one outlet;

wherein the second waterline is at a height above the first waterline to drive the flow path to provide cooling of the container and the at least one computing device therein.

2. The system according to claim 1, wherein the structure is or is part of a boat or a ship or an offshore platform or a floating structure.

3. The system according to claim 1, wherein the structure defines an internal space, wherein the internal volume of water and the container are in the internal space and wherein the internal space is sealed such that the environment within the internal space can be controlled.

4. The system according to claim 1, wherein the at least one outlet comprises at least one flow control device configured to control the flow of water from the internal volume of water to the body of water.

5. The system according to claim 1, wherein the container comprises a heat exchanger configured to remove heat from the computing device, wherein the flow path of water across the container is at least partially across the heat exchanger.

6. The system according to claim 1, wherein the container comprises at least one electrical connection for receiving power and/or data communications, wherein the at least one electrical connection is located on a portion of the container not submerged in water.

7. The system according to claim 1, wherein the inlet pipe is between 20 m and 200 m long, or between 50 m and 150 m long, or between 75 m and 125 m long or 100 m long.

8. The system according to claim 1, wherein the inlet pipe is configured to move water from a depth (d) in the body of water which is deeper than the draught of the structure.

9. The system according to claim 1, wherein the inlet pipe is telescopic and is configured to move between a collapsed configuration and an expanded configuration.

10. The system according to claim 1, wherein the inlet pipe is arranged to deliver water to the internal volume above the second waterline.

11. The system according to claim 1, wherein the inlet pipe is arranged to deliver water to the internal volume in an upper half of the internal volume.

12. The system according to claim 1, wherein the height (h) of the second waterline above the first waterline is between 1 cm and Im, or between 1 cm and 10 cm, or between 4 cm and 8 cm, or between 5 cm and 6 cm.

13. The system according to claim 1, further comprising a control system configured to control the pumping of water through the inlet pipe and the draining of water through the at least one outlet, such that the second waterline is maintained at a height above the first waterline.

14. The system according to claim 1, wherein the inlet pipe is configured to move water from a depth (d) in the body of water where the temperature of the water is less than at the surface of the body of water.

15. The system according to claim 1, wherein the structure is partially opaque or fully opaque.

16. A method of cooling the at least one computing device using water, the method comprising the steps of:

providing a system for cooling the at least one computing device according to claim 1;

pumping water from the body of water to the internal volume of water to maintain the second waterline at a height above the first waterline; and maintaining a flow path of water across the container by draining water from the internal volume to the body of water via the at least one outlet.

17. The method according to claim 16, wherein the step of pumping water comprises pumping water from a depth deeper than the draught of the structure.

18. The method according to claim 16, wherein the step of pumping water comprises pumping water from a depth in the body of water where the water temperature is lower than at the surface of the body of water.

19. A system for cooling a computing device using water, the system comprising:

a body of water defining a first waterline;

a structure at least partially submerged in the body of water and comprising:

an internal volume of water defining a second waterline;

an outlet configured to drain water from the internal volume of water to the body of water;

the computing device configured to generate heat in use and at least partially submerged in the internal volume of water;

an inlet pipe configured with a pump to move water from the body of water to the internal volume of water; and a flow path of water across the computing device towards the outlet;

wherein the second waterline is at a height above the first waterline to drive the flow path to provide cooling of the computing device.

20. A system for cooling a data center using water, the system comprising:

a body of water defining a first waterline;

a structure at least partially submerged in the body of water and comprising:

an internal volume of water defining a second waterline;

at least one outlet configured to drain water from the internal volume of water to the body of water;

a plurality of containers each at least partially submerged in the internal volume of water and together comprising the data center configured to generate heat in use;

an inlet pipe configured with a pump to move water from the body of water to the internal volume of water; and a flow path of water across the plurality of containers towards the at least one outlet;

wherein the second waterline is at a height above the first waterline to drive the flow path to provide cooling of the plurality of containers and the data center therein.

* * * * *